United States Patent
Wieczorek et al.

Patent No.: US 6,255,214 B1
Date of Patent: Jul. 3, 2001

(54) METHOD OF FORMING JUNCTION-LEAKAGE FREE METAL SILICIDE IN A SEMICONDUCTOR WAFER BY AMORPHIZATION OF SOURCE AND DRAIN REGIONS

(75) Inventors: Karsten Wieczorek, Reichenberg-Boxdorf (DE); Nick Kepler, Saratoga; Paul R. Besser, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/256,782

(22) Filed: Feb. 24, 1999

(51) Int. Cl.[7] .................................................. H01L 21/44
(52) U.S. Cl. ....................... 438/659; 438/660; 438/663; 438/664
(58) Field of Search ................................... 438/655, 656, 438/659, 661, 663, 664, 660

(56) References Cited

U.S. PATENT DOCUMENTS

| 4,683,645 | | 8/1987 | Naguib et al. | |
|---|---|---|---|---|
| 5,571,735 | * | 11/1996 | Mogami et al. | 437/41 |
| 6,037,204 | * | 3/2000 | Chang et al. | 438/231 |
| 6,072,222 | * | 6/2000 | Nistler | 257/383 |
| 6,096,628 | * | 8/2000 | Greenlaw et al. | 438/530 |

FOREIGN PATENT DOCUMENTS 0 651 076   5/1995   (EP) .

OTHER PUBLICATIONS

"Doping Technologies", Materials and Bulk Processes, SIA Roundup, 1994, pp. 118–121.
"Ultra Shallow Junction Formation Using Diffusion from Silicides", H. Jiang et al., J. Electrochem. Soc., vol. 139, No. 1, Jan. 1992, pp. 196–218.

\* cited by examiner

Primary Examiner—Richard Elms
Assistant Examiner—Bradley Smith

(57) ABSTRACT

A method for forming ultra shallow junctions in a semiconductor wafer with reduced junction leakage arising from a silicidation process amorphizes the semiconductor material in the gate and source/drain junctions prior to the deposition of the metal during silicidation. After the gate and source/drain junctions are formed in a semiconductor device, non-dopant material, such as silicon or germanium, is implanted into the semiconductor material in an unmasked implantation procedure. This highly controllable implanting creates amorphous silicon regions with a substantially smooth interface with the crystalline silicon. When the silicide regions are formed during subsequent annealing steps, the silicide forms in a manner that follows the amorphous regions so that the silicide/silicon interface is also substantially smooth and junction leakage induced by silicidation is prevented.

7 Claims, 3 Drawing Sheets

METHOD OF FORMING JUNCTION-LEAKAGE FREE METAL SILICIDE IN A SEMICONDUCTOR WAFER BY AMORPHIZATION OF SOURCE AND DRAIN REGIONS

FIELD OF THE INVENTION

The present invention relates to the field of semiconductor device manufacturing, and more particularly, to the formation of low resistivity self-aligned silicide regions on the gate and source/drain junctions.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$ and NiSi. The metal is deposited with a uniform thickness across the entire semiconductor wafer. This is accomplished using, for example, physical vapor deposition (PVD) from an ultra-pure sputtering target and a commercially available ultra-high vacuum (UHV), multi-clamber, DC magnetron sputtering system. Deposition is performed after both gate etch and source/drain junction formation. After deposition, the metal blankets the polysilicon gate electrode, the oxide spacers, tile oxide isolation, and the exposed source and drain electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20, comprising cobalt, for example, has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 3 in which the higher resistivity metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-linie effects. This is described in European Publication No. 0651076. Cobalt silicide ($CoSi_2$) has been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as titanium, platinum, or palladium are that cobalt silicide provides low resistivity, allows lower-temperature processing, and has a reduced tendency for forming diode-like interfaces.

One of the concerns associated with cobalt silicide technologies is that of junction leakage, which occurs when cobalt silicide is formed such that it extends to the bottom and beyond of the source and drain junctions. An example of this occurrence is depicted in FIG. 3. The source of this problem is roughness at the interface of the cobalt silicide and the silicon. The interface roughness arises out of line defects that are present in the silicon. Cobalt is the diffusing species in the initial reaction with silicon in a first annealing step to form the monosilicide, CoSi. The cobalt diffuses preferentially along the line defects, creating "spikes", so that the interface of the CoSi and silicon (Si) is uneven. Hence, the thickness of the CoSi is not uniform, and extends deeper into the source and drain junctions where line defects are present. When a second annealing step is performed to form the lower resistivity phase disilicide $CoSi_2$, the silicide extends even further downwards towards the bottom of the source and drain junctions, and possibly through them. The rough interface and spike formation causes $CoSi_2$ induced excess junction leakage. One way to account for this problem is to make the junctions deeper, so that the uneven silicide will not reach the bottom of the source and drain junctions. Making the junctions deeper, however, negatively impacts device performance.

SUMMARY OF THE INVENTION

There is a need for a method of producing ultra-shallow junctions while avoiding salicide-induced junction leakage.

This and other needs are met by embodiments of the present invention which provides a method of forming ultra-shallow junctions in a semiconductor wafer with reduced junction leakage arising from a silicidation process. In this method, the gate and the source/drain junctions are first formed by doping a semiconductor material. A region of the formed gate and source/drain junctions are amorphized to form amorphous regions within the formed gate and source/drain junctions. A metal layer is then deposited over the gate and the source/drain junctions. Low resistivity metal silicide regions are formed on the gate and source/drain junctions by annealing.

By amorphizing regions of the gate and source/drain junctions prior to the silicidation process, a controllable interface between the silicide and the semiconductor material is achievable. A smooth interface between amorphous silicon and the crystalline silicon leads to a substantially smoother interface between the silicide and the silicon as compared to prior art processing. This avoids interface roughness and spike formation and thereby reduces or eliminates silicidation induced junction leakage. The controllable nature of the interface allows ultra-shallow junctions to be formed, since there is a reduced risk of the interface or spikes extending to the bottom of the source/drain junctions. The present invention thereby provides sufficient distance between the bottom of the silicide and the bottom of the source/drain junction so that there will be no junction leakage.

The earlier stated needs are also met by another embodiment of the present invention which provides a method of manufacturing a semiconductor device comprising doping semiconductor material to form a gate and source/drain junctions. Amorphous regions are formed within the gate and source/drain junctions. The amorphous regions have substantially smooth interfaces with the semiconductor material. A metal layer, such as a cobalt layer, is deposited over the gate and source/drain junctions. The metal silicide regions are formed on the gate and source/drain junctions by annealing.

In still further embodiments of the present invention, the earlier stated needs are met by an article comprising a semiconductor device having a gate and source/drain junctions, and metal silicide regions on the gate and source/drain junctions. The metal silicide regions have a substantially smoother interface with the semiconductor material.

Additional features and advantages of the present invention will become readily apparent to those skilled in the art from the following detailed description, when embodiments of the invention are described, simply by way of illustration of the best mode contemplated for carrying out the invention. As will be realized, the invention is capable of other and different embodiments and its several details are capable of modifications and various obvious respects, all without departing from the invention. Accordingly, the drawings and description are to be regarded as illustrative in nature, and not as restrictive.

DETAILED DESCRIPTION OF THE INVENTION

The present invention allows ultra-shallow junction formation by controlling the thickness of the silicide and making the silicide/silicon interface relatively uniform. This is accomplished in certain embodiments by ion implantation into the silicon prior to deposition of the refractory metal layer used in the formation of the silicide. This amorphizes the silicon and is a very controllable process, so that the depth of the amorphous silicon is also extremely controllable. The depth of the amorphous silicon determines the thickness of the preliminarily formed monosilicide (e.g., CoSi) reducing the amount of silicon consumption during salicidation. The thickness (and interface smoothness) of the final $CoSi_2$ layer is determined by the thickness of the initial CoSi layer and therefore by the easily controllable implant conditions. The CoSi2/Si interface follows the smooth amorphotis/crystal line interface, thus avoiding excess roughness and spike formation, a key cause for $CoSi_2$ induced excess junction leakage. This allows junctions to be made shallower and improve device performance.

Figure 1:
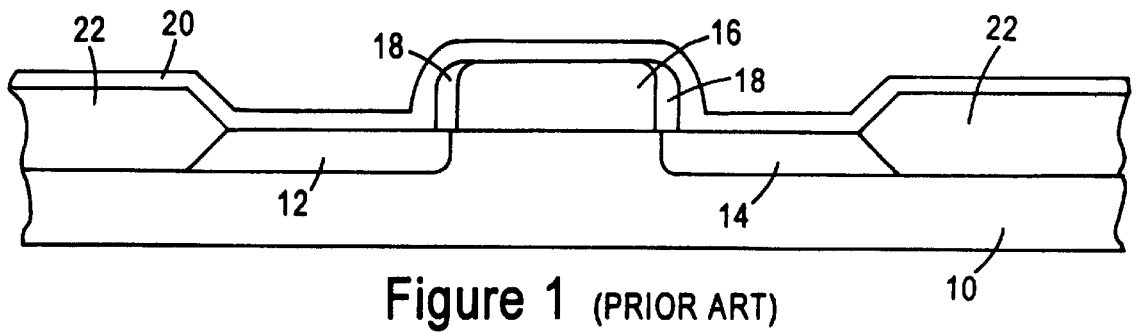
FIG. 1 is a cross-section of a portion of a semiconductor wafer processed in accordance with the prior art during one step of a salicide process.
Figure 2:
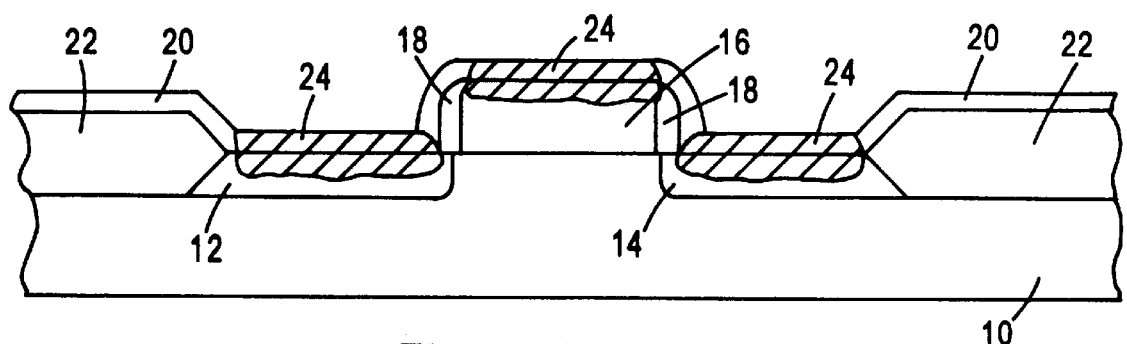
FIG. 2 depicts the cross-section of FIG. 1 after a first rapid thermal anneal step to form a high resistivity metal silicide region in accordance with the prior art.
Figure 3:
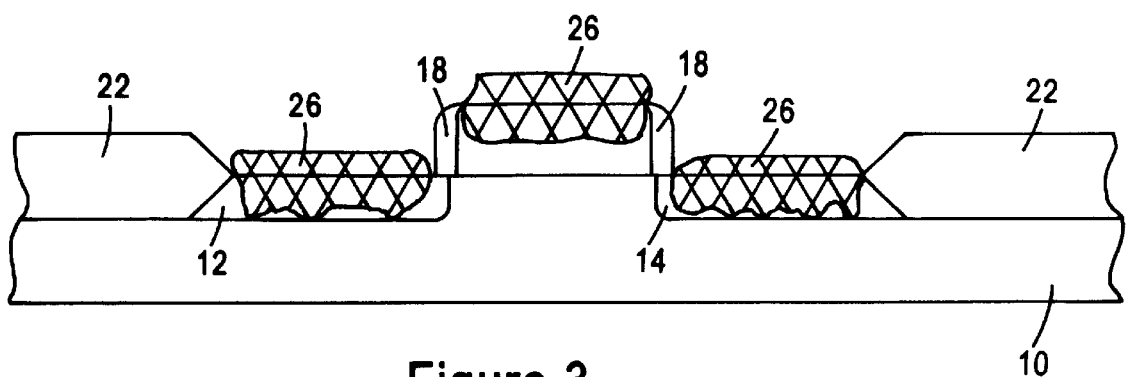
FIG. 3 is a cross-section of the semiconductor wafer of FIG. 2 following a second rapid thermal annealing step to form lower resistivity metal silicide regions in accordance with the prior art, depicting an uneven silicide/silicon interface and spike formation.
Figure 4:
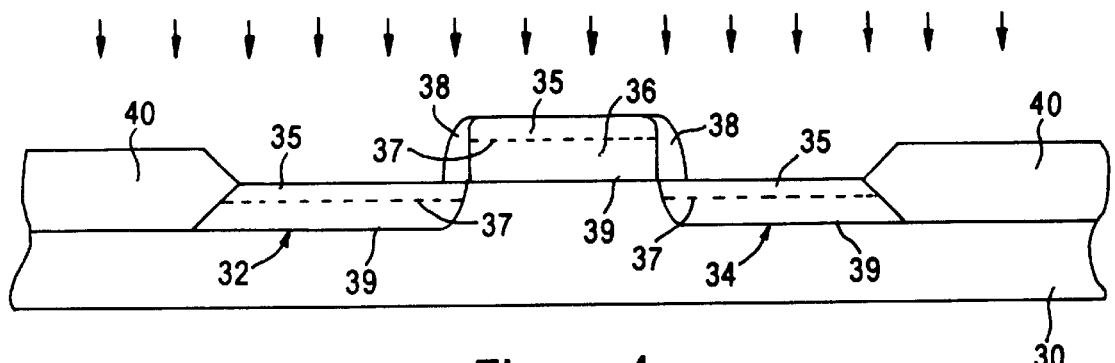
FIG. 4 is a cross-section of a portion of a semiconductor wafer prior to a salicidation process in accordance with certain embodiments of the present invention, during amorphization of the silicon regions.

FIG. 4 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

After the source and drain junctions 32, 34 have been formed, ion implantation is performed, prior to deposition of a metal refractory layer. The arrows in FIG. 4 indicate the ion implantation process. In certain preferred embodiments of the invention, the ion implantation is an unmasked implantation process.

Examples of suitable implanted species include silicon (Si) and germanium (Ge), although the invention is not limited to such species. The implantation process amorphizes the silicon to create an amorphous silicon region 35. The interface of the amorphous silicon region 35 with the crystalline silicon region 39 is denoted by reference numeral 37. The depth of the amorphous silicon region 35 is very controllable, and depends on the implantation energy. As an example, Ge may be implanted at a concentration of $10^{15}$ $cm^2$ and with an energy of 40 keV. This will create an amorphous region that is approximately 300 A in depth, to the interface 37. For comparison purposes, in this example, the junction depth may be from greater than 300 to approximately 1500 A.

As the ion implantation process is readily and precisely controllable, the interface 37 may be made relatively smooth, so that the amorphous silicon region 35 is of substantially uniform thickness. This is advantageous since the thickness of the CoSi layer, and the later formed CoSi$_2$ layer are determined by the thickness of the amorphous silicon region 35. The more uniform the amorphous silicon region 35, the more uniform the interface between the CoSi$_2$ layer and the silicon region 39.

With the amorphous silicon region 35 now formed in accordance with the present invention, a layer of refractory metal 42 is then deposited uniformly across the entire wafer, preferably using physical vapor deposition from an ultra-pure sputtering target and a commercially available ultra-high-vacuum, multi-chamber, DC magnetron sputtering system. In certain preferred embodiments, the metal is cobalt (Co). The metal can be uncapped or capped with Ti or TiN. Cobalt has a number of advantages over other types of metals. For example, in comparison to cobalt silicide, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only. Another example of a metal that is the diffusing species in the first phase of a silicidation process is nickel (Ni).

Figure 5:
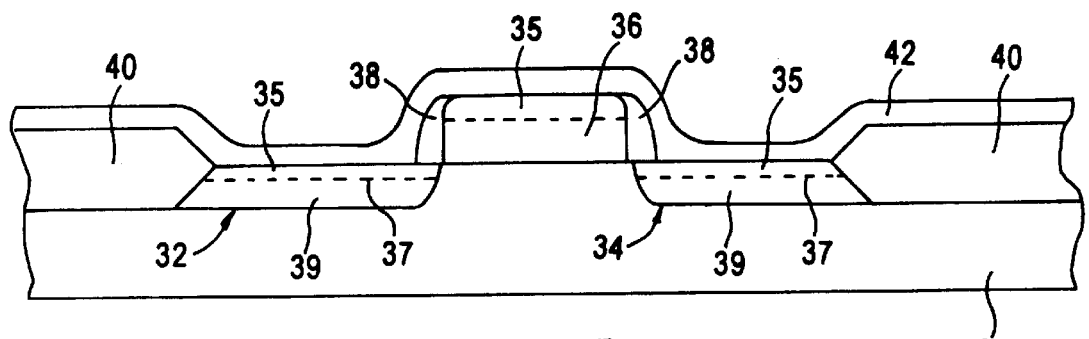
FIG. 5 is a depiction of the semiconductor device of FIG. 4, following the application of a metal layer, such as cobalt, in accordance with certain embodiments of the present invention.
Figure 6:
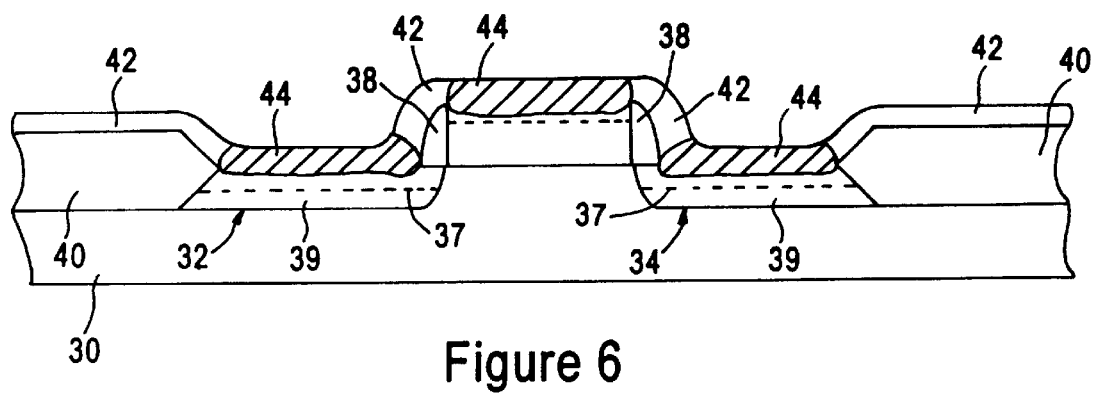
FIG. 6 depicts the semiconductor device of FIG. 5 following a first rapid thermal anneal step to form high resistivity metal silicide regions in accordance with embodiments of the present invention.

FIG. 6 depicts the semiconductor device of FIG. 5 after the formation of high resistivity metal silicide regions. In certain preferred embodiments, the high resistivity metal silicide regions 44 are created by a rapid thermal anneal step. The high resistivity metal silicide regions 44 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 6, some of the silicon in the source and drain junctions 32, 34 is consumed during the first rapid thermal annealing step to become part of the high resistivity metal silicide regions 44. This is true also for the silicon in the polysilicon gate 36.

The depth of the amorphous silicon regions 35 determines the depth of the high resistivity metal silicide regions 44. As depicted in FIG. 6, the high resistivity metal silicide regions 44 do not extend completely down to the interfaces 37 between the amorphous silicon regions 35 and the crystalline silicon regions 39. However, the bottom of the high resistivity metal silicide regions 44 generally follow the amorphous silicon/crystalline silicon interfaces 37. The amorphous silicon/crystalline silicon interfaces 37 are therefore relatively smooth.

Figure 7:
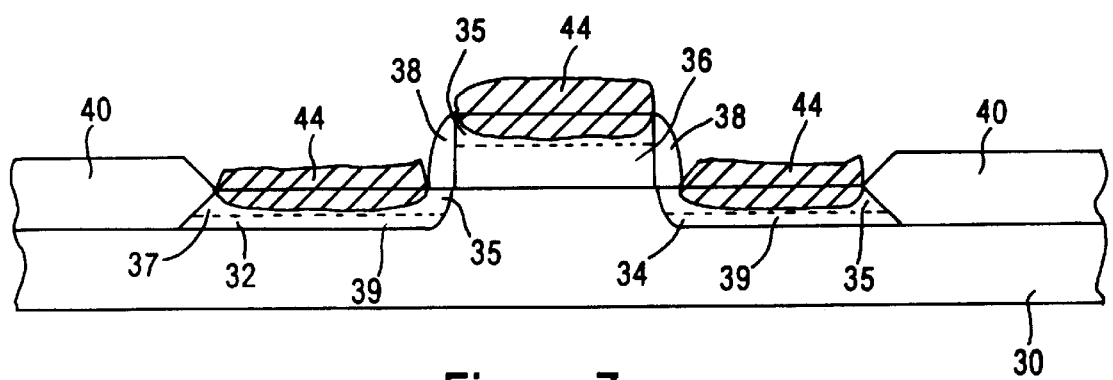
FIG. 7 depicts the semiconductor device of FIG. 6 following a selective etch that removes unreacted metal in accordance with embodiments of the present invention.

Prior to the supplying of additional silicon, a selective etch is performed to remove any unreacted refractory metal, such as cobalt. Typical etchants employed to remove unreacted cobalt is 3HCl:H$_2$O$_2$, and another is H$_2$SO$_4$:H$_2$O$_2$. Removal of the unreacted metal by the peroxide solution leaves the silicide regions 44 intact. The resultant structure is depicted in FIG. 7.

Figure 8:
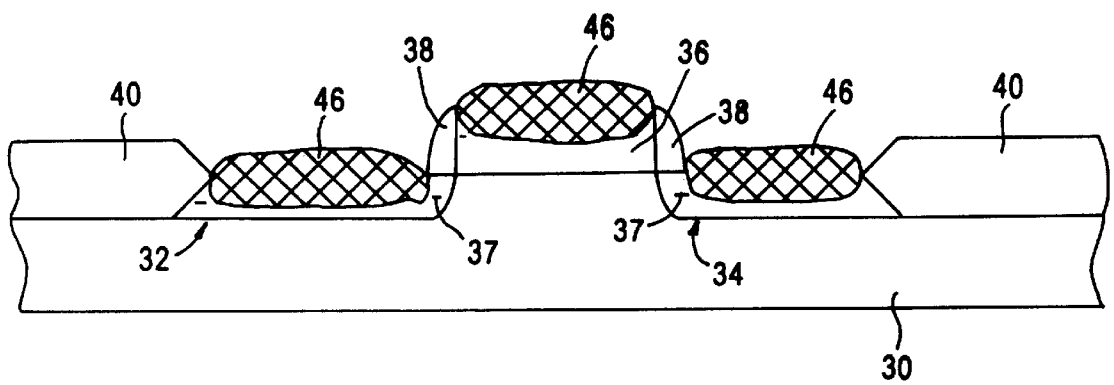
FIG. 8 is a depiction of the semiconductor device of FIG. 7 after a second rapid thermal annealing is performed to form lower resistivity metal silicide regions, in accordance with embodiments of the present invention.

A second rapid thermal anneal step is now performed to produce lower resistivity metal silicide regions 46, such as CoSi$_2$, as depicted in FIG. 8. The second rapid thermal anneal step exposes the semiconductor wafer to a higher temperature than employed in the first rapid thermal anneal step. For example, the temperature in this second rapid thermal anneal step is between about 600° C. and about 850° C. The semiconductor wafer is exposed to the high temperature for between about 5 and about 90 seconds. During this second rapid thermal anneal step, the higher resistivity monosilicide (e.g. CoSi) is converted to lower resistivity disilicide (e.g. CoSi$_2$).

During the second rapid thermal anneal step, the silicide region expands somewhat, and extends deeper in the substrate below the amorphous/crystallinie silicon interfaces 37, as depicted in FIG. 8. Advantageously, the silicide/silicon interface substantially follows the amorphous/crystalline silicon interface, and is therefore relatively smooth. Spike formation is avoided, preventing junction leakage.

Since the silicide/silicon interface smoothness is readily and relatively precisely controlled by the embodiments of the present invention, there is little chance for the silicide to extend to the bottom and beyond of the junctions 32, 34. The controllability of the silicide depth and interface roughness allows shallower junctions to be employed than otherwise possible, since deeper junctions providing a relatively large margin of safety below the silicide to avoid junction leakage are rendered unnecessary. With shallower junctions, improvements in device performance are achieved.

The embodiments of the present invention allow ultra-shallow junctions to be formed and employed in a semiconductor device with a low resistivity metal silicide, such as cobalt (CoSi$_2$) while avoiding junction leakage due to silicide/silicon interface roughness and spike formation. An exemplary embodiment has been described in which cobalt is employed as the refractory metal in forming the silicide. However, the present invention finds utility in other applications employing other materials in which a monosilicide is transferred to a disilicide, where the metal is the diffusing species in the first reaction, and silicon in the second reaction.

Only certain preferred embodiments of the present invention and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming ultra-shallow junctions in a semiconductor wafer with reduced junction leakage arising from a silicidation process, comprising the steps of:

forming a gate and source/drain junctions by doping a semiconductor material;

amorphizing a region of the formed gate and source/drain junctions to form amorphous regions within the formed gate and source/drain junctions including controlling the roughness of an interface between the amorphous regions and the semiconductor material by implanting ions of non-dopant material into the semiconductor material to amorphize the semiconductor material;

depositing a cobalt layer over the gate and source/drain junctions; and annealing to form low resistivity cobalt silicide regions on the gate and source/drain junctions;

wherein the non-dopant material includes at least one of silicon and germanium and wherein the non-dopant material ions are implanted at a concentration of between about $10^{14}$ ions/cm$^2$ and about $10^{16}$ ions/cm$^2$.

2. The method of claim 1, wherein the ions of the non-dopant material are implanted with an implantation energy of between about 20 keV and about 80 keV.

3. The method of claim 1, wherein the low resistivity metal silicide is CoSi$_2$.

4. A method of manufacturing a semiconductor device comprising:

doping semiconductor material to form a gate and source/drain junctions.

amorphizing the semiconductor material of a region of the formed gate and source/drain junctions to a first depth to form amorphous regions within the formed gate and source/drain junctions, the amorphous regions having substantially smooth interfaces with the semiconductor material;

depositing a cobalt layer over the gate and source/drain junctions; and annealing to form cobalt silicide regions on the gate and source/drain junctions, the cobalt silicide regions forming with a thickness approximately equal to the first depth and with a substantially smooth interface between the metal silicide regions and the semiconductor material;

wherein the step of amoiphizing includes implanting non-dopant material into the semiconductor material and wherein the step of implanting includes implanting with an implantation energy of between about 20 keV and about 80 keV.

5. The method of claim 4, wherein the non-dopant material is at least one of silicon and germanium.

6. The method of claim 4, wherein the metal silicide is $CoSi_2$.

7. The method of claim 4, wherein the step of implanting includes implanting non-dopant material ions at a concentration of between $10^{14}$ ions/cm$^2$ and $10^{16}$ ions/cm$^2$.

* * * * *